United States Patent
Lee et al.

(10) Patent No.: US 9,721,750 B2
(45) Date of Patent: Aug. 1, 2017

(54) CONTROLLING CONTAMINATION PARTICLE TRAJECTORY FROM A BEAM-LINE ELECTROSTATIC ELEMENT

(71) Applicant: Varian Semiconductor Equipment Associates, Inc., Gloucester, MA (US)

(72) Inventors: William Davis Lee, Newburyport, MA (US); Alexandre Likhanskii, Malden, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 56 days.

(21) Appl. No.: 14/811,097

(22) Filed: Jul. 28, 2015

(65) Prior Publication Data
US 2017/0032924 A1    Feb. 2, 2017

(51) Int. Cl.
H01J 37/05 (2006.01)
H01J 37/12 (2006.01)
H01J 37/317 (2006.01)

(52) U.S. Cl.
CPC .............. H01J 37/05 (2013.01); H01J 37/12 (2013.01); H01J 37/3171 (2013.01)

(58) Field of Classification Search
CPC .. H01J 37/05; H01J 37/10; H01J 37/12; H01J 37/14; H01J 37/141; H01J 37/147; H01J 37/1471; H01J 37/1472; H01J 37/1477; H01J 37/317; H01J 37/3171; H01J 37/3174
See application file for complete search history.

(56) References Cited

U.S. PATENT DOCUMENTS

| | | | |
|---|---|---|---|
| 5,298,720 A | 3/1994 | Cuomo et al. | |
| 6,476,399 B1 | 11/2002 | Harrington et al. | |
| 6,525,326 B1 | 2/2003 | Harrington et al. | |
| 6,534,775 B1 | 3/2003 | Harrington et al. | |
| 2006/0284117 A1* | 12/2006 | Vanderpot | H01J 37/045 250/492.21 |
| 2007/0295901 A1 | 12/2007 | Kellerman et al. | |
| 2008/0078949 A1* | 4/2008 | Benveniste | H01J 37/05 250/492.21 |

(Continued)

OTHER PUBLICATIONS

ISR and Written Opinion mailed Oct. 20, 2016 in corresponding International Patent Application No. PCT/US2016/042493.

*Primary Examiner* — David E Smith

(57) ABSTRACT

Provided herein are approaches for controlling particle trajectory from a beam-line electrostatic element. In an exemplary approach, a beam-line electrostatic element is disposed along a beam-line of an electrostatic filter (EF), and a voltage is supplied to the beam-line electrostatic element to generate an electrostatic field surrounding the beam-line electrostatic element, agitating a layer of contamination particles formed on the beam-line electrostatic element. A trajectory of a set of particles from the layer of contamination particles is then modified to direct the set of particles to a desired location within the EF. In one approach, the trajectory is controlled by providing an additional electrode adjacent the beam-line electrostatic element, and supplying a voltage to the additional electrode to control a local electrostatic field in proximity to the beam-line electrostatic element. In another approach, the trajectory is influenced by one or more geometric features of the beam-line electrostatic element.

19 Claims, 8 Drawing Sheets

(56) References Cited

U.S. PATENT DOCUMENTS

| | | | | |
|---|---|---|---|---|
| 2010/0163725 A1* | 7/2010 | Barkshire | ............... | H01J 37/05 250/305 |
| 2011/0155921 A1* | 6/2011 | Kellerman | .......... | H01J 37/1477 250/396 R |
| 2012/0168637 A1* | 7/2012 | Radovanov | ............. | H01J 37/12 250/396 R |
| 2014/0366801 A1* | 12/2014 | Kabasawa | ........... | H01J 37/3007 118/712 |

* cited by examiner

CONTROLLING CONTAMINATION PARTICLE TRAJECTORY FROM A BEAM-LINE ELECTROSTATIC ELEMENT

FIELD OF THE DISCLOSURE

The disclosure relates generally to techniques for manufacturing electronic devices, and more particularly, to techniques for reducing particle contamination, generated within a process chamber, from reaching a wafer.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a desired doping profile, one or more dopants may be implanted in the form of ions in various doses and various energy levels.

A conventional ion implantation system may comprise an ion source and a series of beam-line components. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having desired species, shape, energy, and other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

The ion implanter system generates a stable, well-defined ion beam for a variety of different ion species and extraction voltages to desirably operate the ion source for extended periods of time, while avoiding the need for maintenance or repair. After several hours of normal operation using source gases (such as $AsH_3$, $PH_3$, $BF_3$, and other species), beam constituents eventually create deposits on beam optics. Beam optics within a line-of-sight of the wafer also become coated with residues from the wafer, including Si and photoresist compounds. These residues build up on the beam-line components, causing spikes in the DC potentials during normal operation (e.g., in the case of electrically biased components) and eventually flake off, causing an increased likelihood of particulate contamination on the wafer.

Effectiveness of plasma etching and deposition in electronic device fabrication is reduced by contamination problems. Particulate contamination can result in device failure, poor film quality, changes in material resistivity, and impurity permeation. Further, as device dimensions are reduced, tighter control of the etching profile translates to ever more stringent restrictions on the allowable particle contamination number, density and size.

Furthermore, the effects of particulate contamination can be magnified when selective plasma etching processes are used. Certain plasma etching processes rely on a combination of feed gases and etching conditions to selectively etch material surfaces on the wafer. The chemical formation of particulates, etching at a slow rate in these highly selective plasmas, results in micromasking, or an irregular surface often referred to as "grass". This spike or hill of unreacted material may also degrade the device performance and reduce process yield.

SUMMARY

In view of the foregoing, providing is a system and method for controlling particle trajectory from a beam-line electrostatic element of a beam-line component, wherein an additional electrostatic element is provided in proximity to the beam-line electrostatic element to shape a local electrostatic field in proximity to the beam-line electrostatic element to create a field shape to prohibit or limit the transport of particle defects along an ion beam-line of the beam-line component. Moreover, controlling the trajectory of the particle defects using one or more geometric features of the beam-line electrostatic element is advantageous.

An exemplary system in accordance with the present disclosure may include a beam-line component including a beam-line electrostatic element disposed along an ion beam-line, and an additional electrode adjacent the beam-line electrostatic element. One or more power sources are configured to supply a voltage to the beam-line electrostatic element to generate an electrostatic field to accelerate ions along the ion beam-line. The one or more power sources are further configured to supply a voltage to the additional electrode to control a local electrostatic field in proximity to the beam-line electrostatic element.

An exemplary electrostatic filter (EF) may include a plurality of conductive beam optics disposed along an ion beam-line, and an additional electrode adjacent the plurality of conductive beam optics. The EF further includes one or more power sources in communication with the plurality of conductive beam optics and the additional electrode, the one or more power sources configured to supply a voltage to the plurality of conductive beam optics to generate a beam-line electrostatic field to accelerate ions along the ion beam-line, wherein the voltage supplied to the plurality of conductive beam optics agitates a layer of contamination particles from a surface of the plurality of conductive beam optics. The one or more power sources are further configured to supply a voltage to the additional electrode to control a local electrostatic field in proximity to one or more of the plurality of conductive beam optics, wherein the local electrical field modifies a velocity of a set of particles from the layer of contamination particles to control a trajectory of the set of particles in proximity to the one or more of the plurality of conductive beam optics.

An exemplary method in accordance with the present disclosure may include disposing a beam-line electrostatic element along a beam-line of an electrostatic filter (EF), and supplying a voltage to the beam-line electrostatic element to generate an electrostatic field to accelerate ions along the ion beam-line, the voltage agitating a layer of contamination particles formed on a surface of the beam-line electrostatic element. The method may further include controlling a trajectory of a set of particles from the layer of contamination particles to direct the set of particles to a desired location within the EF.

Figure 1:
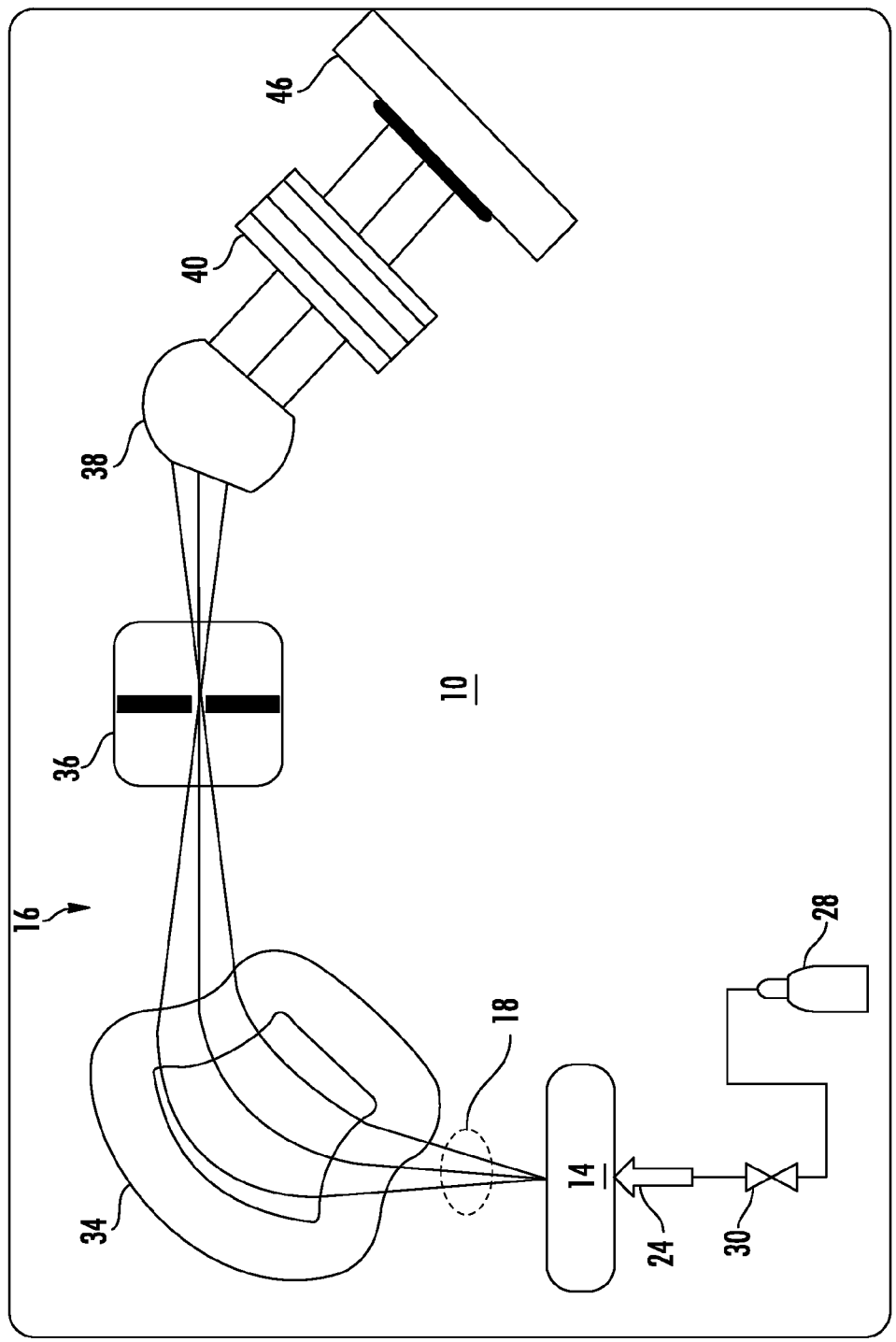
FIG. 1 is a schematic view illustrating an ion implantation system in accordance with the present disclosure.

The drawings are not necessarily to scale. The drawings are merely representations, not intended to portray specific parameters of the disclosure. The drawings are intended to depict typical embodiments of the disclosure, and therefore are not to be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, the geometry and voltage of an electrostatic element, or lens, are influential in determining an electrostatic element's effect on ions and trajectories of those ions. The surrounding area close to the biased electrostatic element influences the trajectories of particle defects originating on or from the biased electrostatic element. Controlling particle trajectory from the electrostatic element by creating an electrostatic field profile to reduce the transport of particle defects along an ion beam-line is therefore advantageous.

In an exemplary approach, a beam-line electrostatic element is disposed along an ion beam-line of a vertical electrostatic energy filter (VEEF) or electrostatic filter (EF), and a voltage is supplied to the beam-line electrostatic element to generate an electrostatic field surrounding the beam-line electrostatic element. The voltage agitates a layer of contamination particles formed on the beam-line electrostatic element. A trajectory of a set of particles (e.g., one or more particles) from the layer of contamination particles is then modified to direct the set of particles to a desired location within the EF.

In one approach, the trajectory is controlled by providing an additional electrode adjacent the beam-line electrostatic element, and supplying a voltage to the additional electrode to generate a local electrostatic field in proximity to the beam-line electrostatic element. The local electrostatic field modifies the initial velocity of the set of particles, in turn influencing the trajectory of the set of particles. In another approach, the local electrostatic field is influenced by one or more geometric features of the beam-line electrostatic element. In each approach, the electrostatic field profile is shaped so as to direct the set of particles to a desired location within the EF, while preserving ion beam trajectory within the EF.

Referring now to FIG. 1, an exemplary embodiment demonstrating a system 10 in accordance with the present disclosure is shown. The ion implantation system (hereinafter "system") 10 represents a process chamber containing, among other components, an ion source 14 for producing an ion beam 18, an ion implanter, and a series of beam-line components 16. The ion source 14 may comprise a chamber for receiving a flow of gas 24 and generating ions. The ion source 14 may also comprise a power source and an extraction electrode assembly disposed near the chamber. The beam-line components 16 may include, for example, a mass analyzer 34, a first acceleration or deceleration stage 36, a collimator 38, and an electrostatic filter (EF) 40 for accelerating or decelerating the ion beam 18.

In exemplary embodiments, the beam-line components 16 may filter, focus, and manipulate ions or the ion beam 18 to have a desired species, shape, energy, and other qualities. The ion beam 18 passing through the beam-line components 16 may be directed toward a substrate mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above species as non-exhaustive. Depending on the application(s), the species may be used as the dopants or the additional material. In particular, one species used as the dopants in one application may be used as the additional material in another application, or vice-versa.

Figure 2:
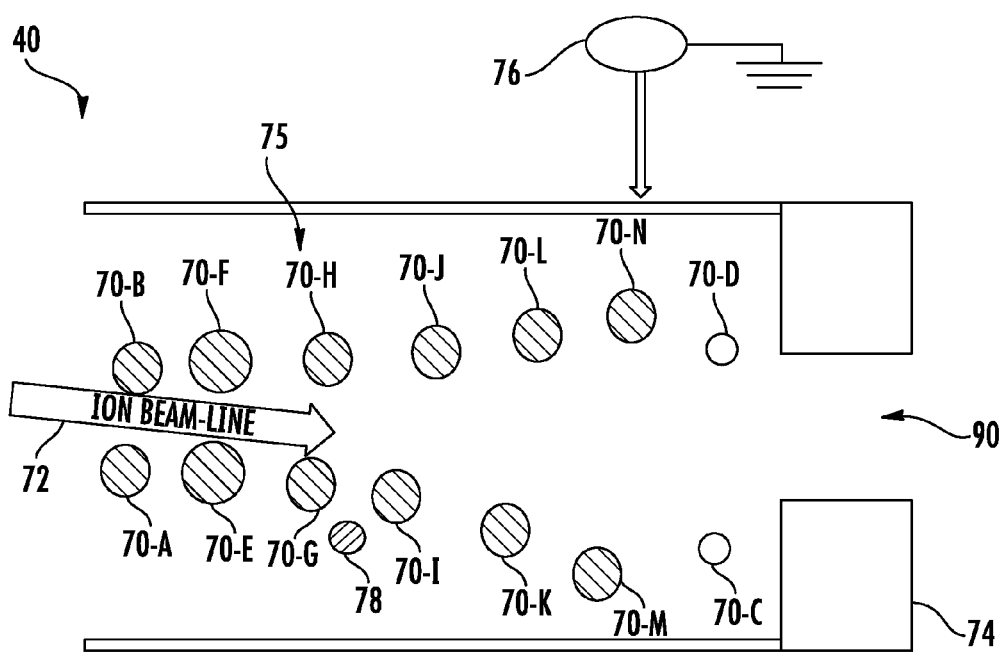
FIG. 2 is a side cross-sectional view illustrating an EF of the ion implantation system shown in FIG. 1 in accordance with the present disclosure.

Referring now to FIG. 2, the EF 40 of the system 10 shown in FIG. 1 will be described in greater detail. In exemplary embodiments, the EF 40 is a beam-line component configured to independently control deflection, deceleration, and focus of the ion beam 18. As will be described in greater detail below, the EF 40 may include a configuration of electrostatic elements (e.g., ion beam optics) comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at each point along the central ion beam trajectory for independently controlling deflection, deceleration, and/or focus of an ion beam.

As shown, the EF 40 includes one or more conductive electrostatic elements 70A-N corresponding to a plurality of beam-line electrodes (e.g., graphite electrode rods). In one embodiment, the beam-line electrostatic elements 70A-N are conductive beam optics disposed along an ion beam-line 72, as shown. In this embodiment, the beam-line electrostatic elements 70A-N are arranged in a symmetrical configuration, wherein the beam-line electrostatic elements 70A-B represent a set of entrance electrodes, the beam-line electrostatic elements 70C-D represent a set of exit electrodes, and the remaining beam-line electrostatic elements 70E-N represent several sets of suppression/focusing electrodes. In another embodiment, the beam-line electrostatic elements 70A-N may be arranged in an asymmetrical configuration. As shown, each set of electrode pairs provides a space/gap to allow the ion beam (e.g., a ribbon beam) to pass therethrough. In exemplary embodiments, the beam-line electrostatic elements 70A-N are provided in a chamber 74.

In one embodiment, the beam-line electrostatic elements 70A-N include pairs of conductive pieces electrically coupled to each other. Alternatively, the beam-line electrostatic elements 70A-N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the beam-line electrostatic elements 70A-N are depicted as seven (7) pairs (e.g., with five (5) sets of suppression/focusing electrodes), any number of elements (or electrodes) may be utilized in various embodiments. For example, the configuration of electrostatic elements 70A-N may utilize a range of three (3) to ten (10) electrode sets.

In some embodiments, the ion beam passing through the electrodes along the ion beam-line 72 may include boron or other elements. Electrostatic focusing of the ion beam may be achieved by using several thin electrodes (e.g., the suppression/focusing electrodes of electrostatic elements 70E-N) to control grading of potential along the ion beam-line 72. In the configuration of electrostatic elements 70A-N shown, high deceleration ratios may also be provided while avoiding over-focusing. As a result, use of input ion beams may be used in an energy range to enable higher quality beams, even for very low energy output beams. In one non-limiting example, as the ion beam passes through the electrodes of the beam-line electrostatic elements 70A-N, the ion beam may be decelerated from 6 keV to 0.2 keV and deflected at 15°. In this non-limiting example, the energy ratio may be 30/1.

During use, the EF 40 receives a voltage and a current from a power supply 76 (e.g., a DC power supply) to generate an electric field to accelerate ions along the ion beam-line 72. More specifically, the voltage/current is supplied to the beam-line electrostatic elements 70A-N, and may be constant or varied. In one embodiment, the beam-line electrostatic elements 70A-N are held at a series of DC potentials from 0.1 keV-100 keV.

As stated above, one cause of degradation to the system 10 (FIG. 1) may be excessive accumulation of particle contaminants or by-products generated by the beam constituents during use. For example, contamination particles may accumulate on the beam-line electrostatic elements 70A-N of the EF 40, as well as on other components of the system 10. In some embodiments, this accumulation of material may be more severe, e.g., when carborane, $SiF_4$ or $GeF_4$ is used as the source material.

Figure 3:
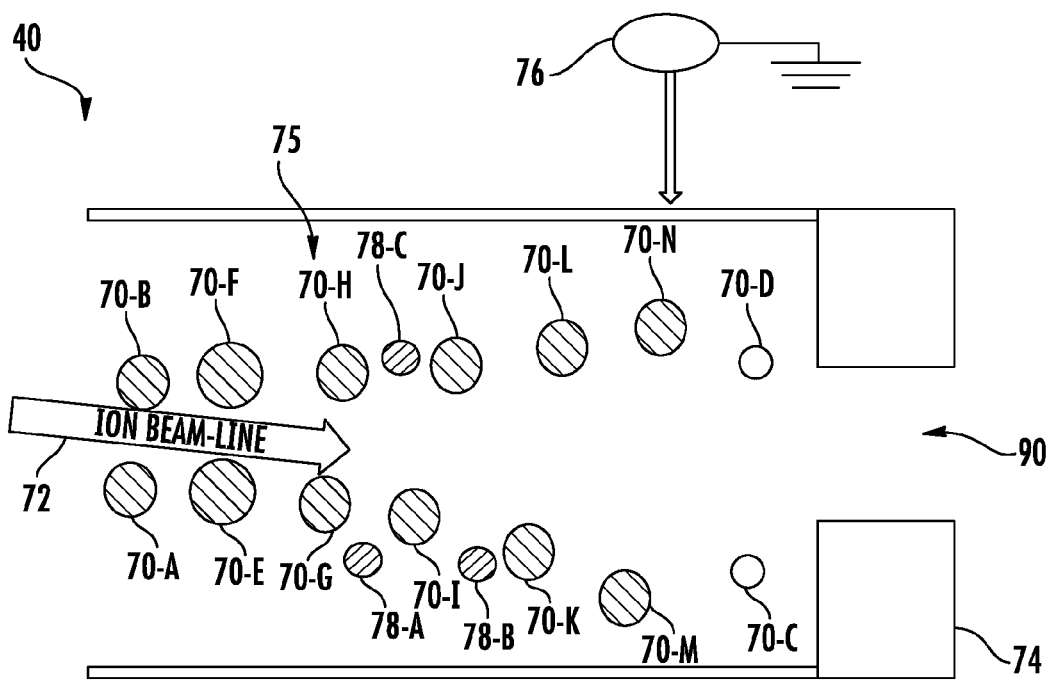
FIG. 3 is a side cross-sectional view illustrating an EF of the ion implantation system shown in FIG. 1 in accordance with the present disclosure.

As shown in FIG. 2, to reduce the transport of the contamination particles along the ion beam-line 72, the EF 40 further includes an additional electrode 78 disposed adjacent one or more beam-line electrostatic elements 70A-N. In the embodiment shown, the additional electrode 78 is positioned proximate electrostatic elements 70-G and 70-I so the electrostatic elements 70-G and 70-I are disposed between the additional electrode 78 and the ion beam-line 72. In other embodiments, for example as shown in FIG. 3, a plurality of additional electrodes 78A-C are provided adjacent one or more of the beam-line electrostatic elements 70A-N.

The additional electrode(s) 78 may be provided in close proximity to one or more of the beam-line electrostatic elements 70A-N for the purpose of shaping a local electrostatic field to reduce the probability of a set of particles, generated on a surface of one or more of the beam-line electrostatic elements 70A-N, being launched into the ion beam-line 72. The additional electrode(s) 78 is configured to locally change the electric field(s) to modify a velocity and resultant trajectory of the set of particles to increase the likelihood of the set of particles being sent to a more benign location than the wafer.

Figure 4A:
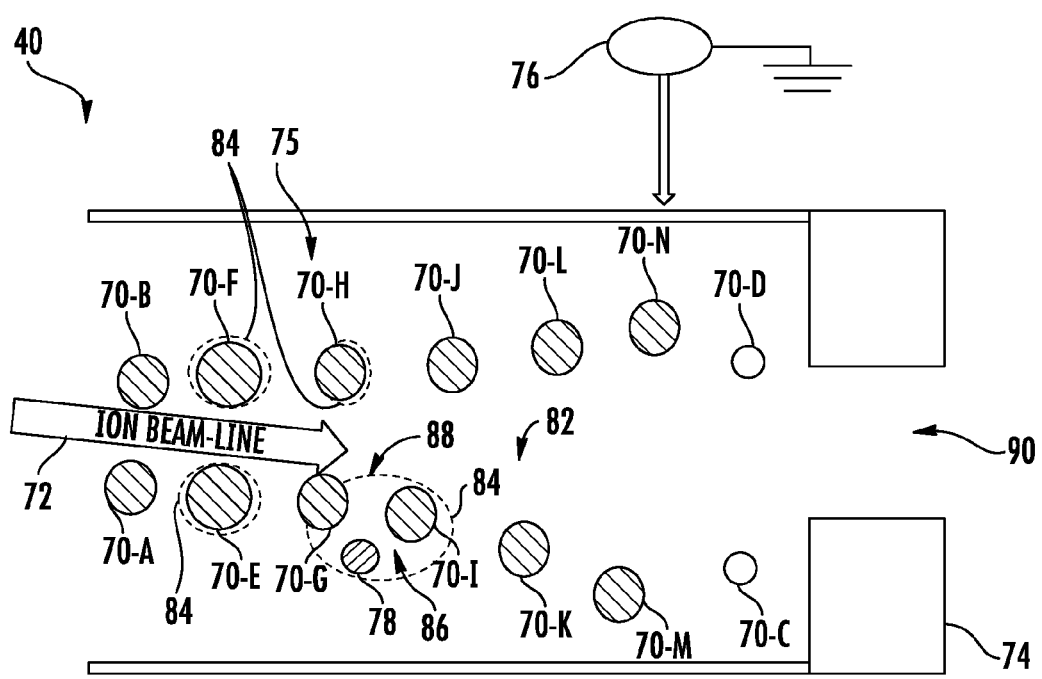
FIGS. 4A-C are illustrations of electrostatic field generation and movement of contamination particles over time within the EF shown in FIG. 2 in accordance with the present disclosure.
Figure 4B:
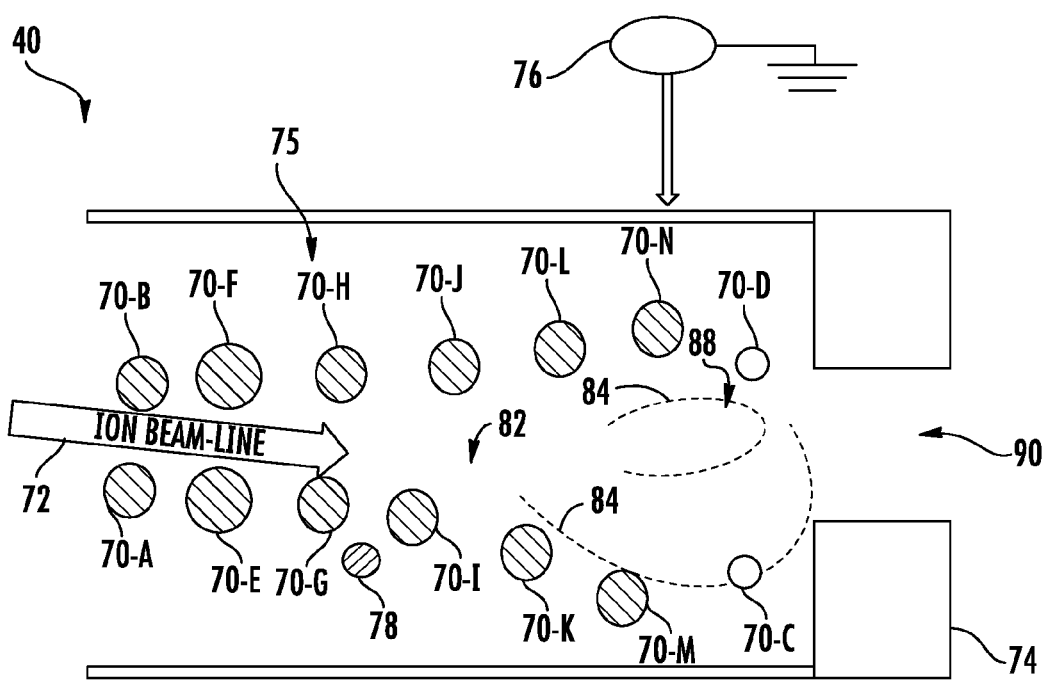
Figure 4C:
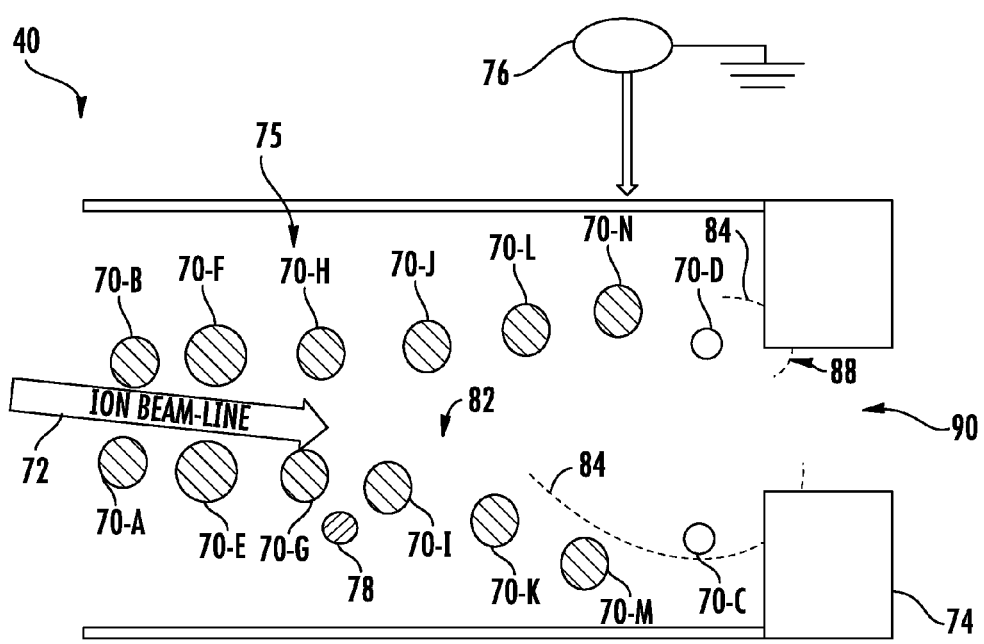

Referring now to FIGS. 4A-C, generation of an electrostatic field and movement of contamination particles within the EF 40 over a period of time in accordance with the present disclosure is shown. In exemplary embodiments, the power supply 76 is configured to supply a voltage to the plurality of electrostatic elements 70A-N to generate a beam-line electrostatic field 82 to accelerate ions along the ion beam-line 72. The voltage supplied to the plurality of electrostatic elements 70A-N also agitates a layer of contamination particles 84 formed on one or more of the plurality of electrostatic elements 70A-N. The contamination particles 84 may become dislodged from a surface of each electrostatic element 70A-N as a result of the voltage, and set into motion within the EF 40 by the beam-line electrostatic field 82, as demonstrated in FIG. 4-A.

The power supply 76 is further configured to supply a voltage to the additional electrode 78 to control a local electrostatic field 86 in proximity to one or more of the plurality of electrostatic elements 70A-N. Specifically, the local electrostatic field 86 modifies a velocity of a set of particles 88 (e.g., all or a subset of particles) from the layer of contamination particles 84 to control a velocity and trajectory of the set of particles 88 in proximity to electrostatic elements 70-G and 70-I. The set of particles 88 may therefore be directed to a desired location within the EF 40.

In one embodiment, the contamination particles 84 generated on the surface of one or more electrodes may be emitted off the electrode in a direction normal to the surface. Each particle may have a negative charge, and leaves the surface of the electrostatic element with a low initial velocity. Particles are then accelerated along the beam-line electrostatic field 82 towards the beam-line electrostatic elements 70C-D, as demonstrated in FIG. 4-B. For example, the set of particles 88 positioned proximate the beam-line electrostatic elements 70-G and 70-I, as demonstrated in FIG. 4-A, travel along beam-line electrostatic field 82 to a position proximate electrostatic elements 70-M and 70-N, as demonstrated in FIG. 4-B.

The set of particles 88 may then be directed to a final location within the EF 40, as demonstrated in FIG. 4-C, instead of through an opening 90 of the EF 40. In exemplary embodiments, the velocity of the set of particles 88 correlates to a desired location of the charged particles 88 traveling in the electrostatic field 82, wherein the velocity is modified based on at least one of: the voltage supplied to the beam-line electrostatic elements 70A-N, the voltage supplied to the additional electrode 78, a charge of the set of particles 88, a strength of the electrostatic field 82, a strength of the local electrostatic field 86, and a mass of the set of particles 88. More specifically, a final velocity (Vf) correlates to a final location of the charged particles traveling in the electrostatic field 82, wherein Vf may be determined according to the following formula (1):

$$\vec{v}_f = \vec{v}_i + \frac{q}{m} \int_t \vec{E}(t') dt' \quad (1)$$

In this embodiment, Vi represents an initial particle velocity, q represents particle charge, m represents a mass of the particle(s), and E represents a strength of the electrostatic field. By tailoring the local electrostatic field 86, the initial velocity (Vi) for the set of particles 88 is changed, resulting in the final velocity (Vf) being changed according to formula (1) so as to prevent, or at least reduce, the number of charged particles traveling in an undesirable direction, e.g., out through the opening 90 and onto the wafer.

Figure 5A:
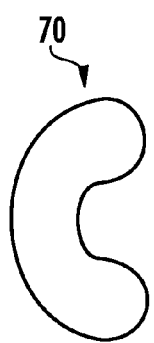
FIG. 5A-C are cross sectional views illustrating various geometric features of a beam-line electrostatic element of the ion implantation system shown in FIG. 1 in accordance with the present disclosure.
Figure 5B:
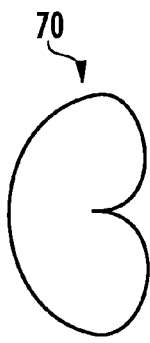
Figure 5C:
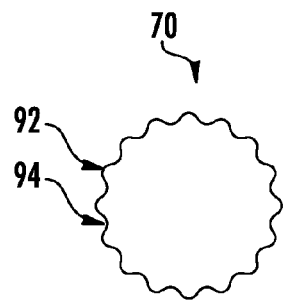

Referring now to FIGS. 5A-C, cross sectional views illustrating various geometric features of exemplary beam-line electrostatic elements (e.g., electrode rods) according to various embodiments of the disclosure are illustrated. In each embodiment, the local electrostatic field may be shaped or influenced by the geometric feature(s) of each electrode rod. The geometric feature(s) effects the initial velocity (Vi) of particles, while also keeping the ion beam-line 72 uniform and thus preserving the ion beam optics.

The beam-line electrostatic element 70 may be an electrode rod having one or more geometric features including, yet not limited to, a circular cross-section (FIGS. 2-4), a lemniscate cross-section (FIG. 5-A), a limacon cross-section (FIG. 5-B), and an exterior surface profile including a plurality of ridges 92 and indentations 94 (FIG. 5-C). Each particle may have a negative charge, and leaves the surface of the electrostatic element 70 in a direction normal to the surface and with a low initial velocity. By modifying or controlling the shape of the electrostatic element 70, the initial trajectory of the particles can be customized.

Particles are then accelerated along the beam-line electrostatic field, for example as demonstrated in FIG. 4A-C. The local electrostatic field surrounding each electrostatic element 70 may be shaped or influenced by the geometric feature(s) of each electrode rod, thus affecting the initial velocity (Vi) and resultant trajectory of the particles. A modified particle trajectory allows a higher percentage of particle defects to be contained within the EF.

Figure 6:
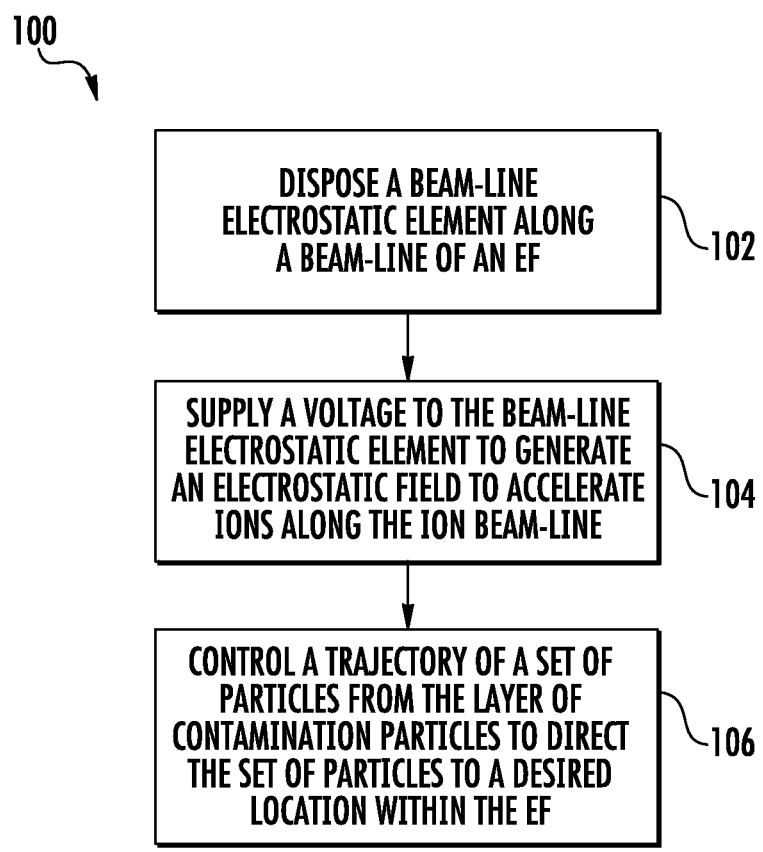
FIG. 6 is a flowchart illustrating an exemplary method according to the present disclosure.

Referring now to FIG. 6, a flow diagram illustrating an exemplary method 100 for controlling particle trajectory from a beam-line electrostatic element in accordance with the present disclosure is shown. The method 100 will be described in conjunction with the representations shown in FIGS. 1-5.

Method 100 includes disposing a beam-line electrostatic element along a beam-line of an EF, as shown in block 102. In some embodiments, the beam-line electrostatic element includes a conductive beam optic. In some embodiments, the beam-line electrostatic element includes an electrode rod. In some embodiments, the EF includes a plurality of beam-line electrostatic elements.

Method 100 further includes supplying a voltage to the beam-line electrostatic element to generate an electrostatic field to accelerate ions along the ion beam-line, as shown in block 104. In some embodiments, the voltage supply agitates a layer of contamination particles formed on a surface of the beam-line electrostatic element. In some embodiments, the voltage is supplied by a direct current (DC) power supply.

Method 100 further includes controlling a trajectory of a set of particles from the layer of contamination particles to direct the set of particles to a desired location within the EF, as shown in block 106. In one embodiment, controlling the trajectory of the set of particles may include providing an additional electrode adjacent the beam-line electrostatic element, and supplying a voltage to the additional electrode to control a local electrostatic field in proximity to the beam-line electrostatic element. In one embodiment, the beam-line electrostatic element is disposed between the additional electrode and the ion beam-line.

In one embodiment, the trajectory of the set of particles may be controlled based a geometric feature of the beam-line electrostatic element. In one embodiment, the geometric feature may include at least one of the following: a circular cross-section, a lemniscate cross-section, a limacon cross-section, and an exterior surface profile including a plurality of indentations.

In one embodiment, controlling the trajectory of the set of particles may include modifying a velocity of the set of particles. In one embodiment, the velocity of the set of particles may be modified based on at least one of: the voltage supplied to the beam-line electrostatic element, the voltage supplied to the additional electrode, a charge of the set of particles, a strength of the electrostatic field, a strength of the local electrostatic field, and a mass of the set of particles. In one embodiment, the voltage supplied to the beam-line electrostatic element may cause an increase in an initial velocity of the set of particles.

In view of the foregoing, at least the following advantages are achieved by the embodiments disclosed herein. Firstly, providing an additional electrostatic element in proximity to the beam-line electrostatic to shape a local electrostatic field in proximity to the beam-line electrostatic element limits the transport of particle defects along an ion beam-line of the beam-line component. Secondly, controlling the trajectory of the particle defects using one or more geometric features of the beam-line electrostatic element shapes the local electrostatic field in proximity to the beam-line electrostatic element, while reducing the need for additional electrodes or components within the beam-line component.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A system, comprising:
a beam-line component including a beam-line electrostatic element disposed along an ion beam-line;
an additional electrode adjacent the beam-line electrostatic element, wherein a position of the additional electrode causes a number of beam-line electrostatic elements and additional electrodes on a first side of the ion beam-line to be different than a number of beam-line electrostatic elements and additional electrodes on a second side of the ion beam-line;
one or more power sources configured to:
supply a voltage to the beam-line electrostatic elements to generate an electrostatic field to accelerate ions along the ion beam-line; and
supply a voltage to the additional electrode to control a local electrostatic field in proximity to the beam-line electrostatic element.

2. The system of claim 1, the beam-line electrostatic element comprising a conductive beam optic.

3. The system of claim 1, the beam-line component comprising an electrostatic filter (EF), the EF including a chamber.

4. The system of claim 3, further comprising a layer of contamination particles formed on a surface of the beam-line electrostatic element, wherein the local electrostatic field generated in response to the voltage supplied to the additional electrode modifies a velocity of a set of particles from the layer of contamination particles to direct the set of particles to a desired location within the chamber.

5. The system of claim 3, further comprising a plurality of beam-line electrostatic elements, wherein one or more of the plurality of beam-line electrostatic elements is disposed between the additional electrode and the ion beam-line.

6. The system of claim 1, further comprising a plurality of additional electrodes.

7. The system of claim 1, wherein the beam-line electrostatic element is an electrode rod having one or more of the following geometric features: a circular cross-section, a lemniscate cross-section, a limacon cross-section, and an exterior surface profile including a plurality of indentations.

8. An electrostatic filter (EF), comprising:
a plurality of conductive beam optics disposed along an ion beam-line;
an additional electrode adjacent the plurality of conductive beam optics, wherein a position of the additional electrode causes a number of beam-line electrostatic elements and additional electrodes on a first side of the ion beam-line to be different than a number of beam-line electrostatic elements and additional electrodes on a second side of the ion beam-line;
one or more power sources in communication with the plurality of conductive beam optics and the additional electrode, the one or more power sources configured to:
supply a voltage to the plurality of conductive beam optics to generate a beam-line electrostatic field to accelerate ions along the ion beam-line; and
supply a voltage to the additional electrode to control a local electrostatic field in proximity to one or more of the plurality of conductive beam optics, wherein the local electrical field modifies a velocity of a set of particles from a layer of contamination particles formed on a surface of the one or more of the plurality of conductive beam optics to control a trajectory of the set of particles in proximity to the one or more of the plurality of conductive beam optics.

9. The EF of claim 8, the one or more power sources further configured to direct the set of particles to a desired location within a chamber of the EF.

10. The EF of claim 8, wherein one or more of the plurality of conductive beam optics is disposed between the additional electrode and the ion beam-line.

11. The EF of claim 8, further comprising a plurality of additional electrodes.

12. The EF of claim 8, wherein one or more of the plurality of conductive beam optics is an electrode rod having at least one of the following geometric features: a circular cross-section, a lemniscate cross-section, a limacon cross-section, and an exterior surface profile including a plurality of indentations.

13. A method comprising:
disposing a beam-line electrostatic element along a beam-line of an electrostatic filter (EF);
supplying a voltage to the beam-line electrostatic element to generate an electrostatic field to accelerate ions along the beam-line, the voltage agitating a layer of contamination particles formed on a surface of the beam-line electrostatic element; and
controlling a trajectory of a set of particles from the layer of contamination particles to direct the set of particles to a desired location within the EF by supplying a voltage to an additional electrode to control a local electrostatic field in proximity to the beam-line electrostatic element, wherein a position of the additional electrode causes a number of beam-line electrostatic elements and additional electrodes on a first side of the ion beam-line to be different than a number of beam-line electrostatic elements and additional electrodes on a second side of the ion beam-line.

14. The method of claim 13, further comprising controlling the trajectory of the set of particles by modifying a velocity of the set of particles.

15. The method of claim 14, further comprising modifying the velocity of the set of particles based on at least one of: the voltage supplied to the beam-line electrostatic element, the voltage supplied to the additional electrode, a charge of the set of particles, a strength of the electrostatic field, a strength of the local electrostatic field, and a mass of the set of particles.

16. The method of claim 14, further comprising increasing the voltage supplied to the beam-line electrostatic element to increase an initial velocity of the set of particles.

17. The method of claim 13, further comprising controlling the trajectory of the set of particles based a geometric feature of the beam-line electrostatic element, the geometric feature including at least one of the following: a circular cross-section, a lemniscate cross-section, a limacon cross-section, and an exterior surface profile including a plurality of indentations.

18. The method of claim 13, further comprising disposing the beam-line electrostatic element between the additional electrode and the beam-line.

19. The method of claim 13, further comprising providing a plurality of additional electrodes adjacent a plurality of beam-line electrostatic elements.

* * * * *